(12) United States Patent
Wong et al.

(10) Patent No.: US 8,938,699 B2
(45) Date of Patent: *Jan. 20, 2015

(54) MULTIVARIABLE SOLVER FOR OPTICAL PROXIMITY CORRECTION

(71) Applicant: ASML Netherlands B.V., Veldhoven (NL)

(72) Inventors: William S. Wong, Ann Arbor, MI (US); Been-Der Chen, Milpitas, CA (US); Yen-Wen Lu, Los Altos, CA (US); Jiangwei Li, Palo Alto, CA (US); Tatsuo Nishibe, Ibaraki (JP)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 13/896,659

(22) Filed: May 17, 2013

(65) Prior Publication Data

US 2013/0311959 A1 Nov. 21, 2013

Related U.S. Application Data (63) Continuation of application No. 13/652,467, filed on Oct. 15, 2012, now Pat. No. 8,448,099, and a continuation of application No. 12/721,331, filed on Mar. 10, 2010, now Pat. No. 8,291,352, and a continuation of application No. 11/764,128, filed on Jun. 15, 2007, now Pat. No. 7,707,538.

(51) Int. Cl.
*G06F 17/50* (2006.01)
*G03F 1/00* (2012.01)
*G03F 1/36* (2012.01)
*G03F 7/20* (2006.01)

(52) U.S. Cl.
CPC *G03F 1/144* (2013.01); *G03F 1/36* (2013.01); *G03F 7/70441* (2013.01); *G03F 7/705* (2013.01)
USPC .......................................................... 716/55

(58) Field of Classification Search
USPC .................................................... 716/50–56
See application file for complete search history.

(56) References Cited

U.S. PATENT DOCUMENTS 6,301,697 B1   10/2001   Cobb
6,928,634 B2 *  8/2005   Granik et al. ............... 716/52

(Continued)

OTHER PUBLICATIONS

Ye Chen et al., "A Feasible Model-Based OPC Algorithm Using Jacobian Matrix of Intensity Distribution Functions," Proceedings of SPIE (2007).

(Continued)

*Primary Examiner* — Stacy Whitmore
(74) *Attorney, Agent, or Firm* — Pillsbury Winthrop Shaw Pittman LLP (57) ABSTRACT

The method of the invention tracks how the collective movement of edge segments in a mask layout alters the resist image values at control points in the layout and simultaneously determines a correction amount for each edge segment in the layout. A multisolver matrix that represents the collective effect of movements of each edge segment in the mask layout is used to simultaneously determine the correction amount for each edge segment in the mask layout.

32 Claims, 7 Drawing Sheets

(56) References Cited

U.S. PATENT DOCUMENTS

| | | | |
|---|---|---|---|
| 6,973,633 B2* | 12/2005 | Lippincott et al. | 716/53 |
| 7,079,223 B2* | 7/2006 | Rosenbluth et al. | 355/67 |
| 7,266,803 B2* | 9/2007 | Chou et al. | 716/51 |
| 7,383,521 B2 | 6/2008 | Smith et al. | |
| 7,523,437 B2 | 4/2009 | Kyoh et al. | |
| 7,707,538 B2* | 4/2010 | Wong et al. | 716/53 |
| 8,291,352 B2* | 10/2012 | Wong et al. | 716/53 |
| 8,448,099 B2* | 5/2013 | Wong et al. | 716/53 |
| 2005/0097500 A1 | 5/2005 | Ye et al. | |
| 2007/0022402 A1 | 1/2007 | Ye et al. | |
| 2007/0143732 A1 | 6/2007 | Bollepalli et al. | |
| 2007/0240086 A1 | 10/2007 | Sinha et al. | |
| 2009/0031261 A1 | 1/2009 | Smith et al. | |
| 2010/0167184 A1 | 7/2010 | Wong et al. | |

OTHER PUBLICATIONS

Nick Cobb et al., "Model-based OPC using the MEEF matrix," 22nd Annual BACUS Symposium of Photomask Technology, Proceedings of SPIE, vol. 4889, pp. 1281-1292 (2002).

Klaus Herold et al., "Managing high accuracy and fast convergence in OPC," Photomask Technology 2006, Proc. of SPIE, vol. 6349, 634924, pp. 1-8 (2006).

Jeffrey B. Layton, "Efficient Direct Computation of the Pseudo-Inverse and its Gradient," John Wiley and Sons, International Journal of Numerical Methods in Engineering, vol. 40, pp. 4211-4223 (1997).

* cited by examiner

(Prior Art)

MULTIVARIABLE SOLVER FOR OPTICAL PROXIMITY CORRECTION

CROSS-REFERENCE TO RELATED APPLICATIONS

This application is a continuation of U.S. application Ser. No. 13/652,467, filed Oct. 15, 2012, now U.S. Pat. No. 8,448,099, which is a continuation of U.S. application Ser. No. 12/721,331, filed Mar. 10, 2010, now U.S. Pat. No. 8,291,352, which is a continuation of U.S. application Ser. No. 11/764,128, filed Jun. 15, 2007, now U.S. Pat. No. 7,707,538, the contents of all such applications being incorporated by reference herein in their entirety.

FIELD OF THE INVENTION

This invention relates generally to resolution enhancement technologies for photolithography masks, and relates more particularly to a multivariable solver for optical proximity correction.

BACKGROUND

In the semiconductor industry, microlithography (or simply lithography) is the process of printing circuit patterns on a semiconductor wafer (for example, a silicon or wafer). Currently, optical lithography is the predominant technology used in volume manufacturing of semiconductor devices and other devices such as flat-panel displays. Such lithography employs light in the visible to the deep ultraviolet spectral range to expose photo-sensitive resist on a substrate. In the future, extreme ultraviolet (EUV) and soft x-rays may be employed. Following exposure, the resist is developed to yield a relief image.

In optical lithography, a photomask (often called a mask or a reticle) that serves as a template for the device structures to be manufactured is first written using electron-beam or laser-beam direct-write tools. A typical photomask for optical lithography consists of a glass (or quartz) plate of six to eight inches on a side, with one surface coated with a thin metal layer (for example, chrome) of a thickness of about 100 nm. The device pattern is etched into the metal layer, hence allowing light to transmit through the clear areas. The areas where the metal layer is not etched away block light transmission. In this way, a pattern is projected onto a semiconductor wafer.

Figure 1:
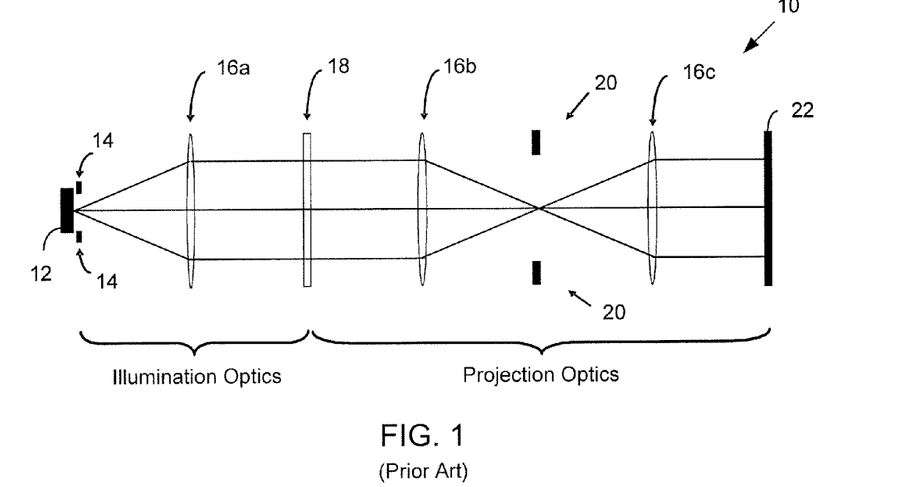
FIG. 1 is a diagram of one embodiment of a lithography system.

The mask contains certain patterns and features that are used to create desired circuit patterns on a wafer. The tool used in projecting the mask image onto the wafer is called a "stepper" or "scanner" (hereinafter collectively called "exposure tool"). FIG. 1 is a diagram of an optical projection lithographic system 10 of a conventional exposure tool. System 10 includes an illumination source 12, an illumination pupil filter 14, a lens subsystem 16a-c, a mask 18, a projection pupil filter 20, and a wafer 22 on which the aerial image of mask 18 is projected. Illumination source 12 may be a laser source operating, for example, at W (ultra-violet) or DW (deep ultra-violet) wavelengths. The light beam of illumination source 12 is expanded and scrambled before it is incident on illumination pupil 14. Illumination pupil 14 may be a simple round aperture, or may have specifically designed shapes for off-axis illumination. Off-axis illumination may include, for example, annular illumination illumination pupil 14 is a ring with a designed inner and outer radii), quadruple illumination illumination pupil 14 has four openings in the four quadrants of the pupil plane), and others such as dipole illumination.

After illumination pupil 14, the light passes through the illumination optics (for example, lens subsystem 16a) and is incident on mask 18, which contains the circuit pattern to be imaged on wafer 22 by the projection optics. As the desired pattern size on wafer 22 becomes smaller and smaller, and the features of the pattern become closer and closer to each other, the lithography process becomes more challenging. The projection optics (for example, lens subsystems 16b and 16c, and projection pupil filter 20) images mask 18 onto wafer 22. Pupil 20 of the projection optics limits the maximum spatial frequency of the mask pattern that can be passed through the projection optics system. A number called "numerical aperture" or NA often characterizes pupil 20.

When the resist is exposed by the projected image and thereafter baked and developed, the resist tends to undergo complex chemical and physical changes. The final resist patterns are typically characterized by their critical dimensions, or CD, usually defined as the width of a resist feature at the resist-substrate interface. While the CD is usually intended to represent the smallest feature being patterned in the given device, in practice the term CD is used to describe the linewidth of any resist feature.

In most exposure tools, the optical system reduces the size of the pattern from the mask level to the wafer level by a reduction factor, typically 4× or 5×. Because of this the pattern at the mask level is typically larger than the desired pattern at the wafer level, which relaxes the dimensional control tolerances required at the mask level and improves the yield and manufacturability of the mask-making process. This reduction factor of the exposure tool introduces a certain confusion in referring to "the dimension" of the exposure process. Herein, features sizes and dimensions refer to wafer-level feature sizes and dimensions, and the "minimum feature size" refers to a minimum feature at the wafer level.

For an exposure process to pattern a device correctly, the CDs of all critical structures in the device must be patterned to achieve the design target dimensions. Since it is practically impossible to achieve every target CD with no errors, the device is designed with a certain tolerance for CD errors. In this case, the pattern is considered to be acceptable if the of all critical features are within these predefined tolerances. For the exposure process to be viable in a manufacturing environment, the full CD distribution must fall within the tolerance limits across a range of process conditions that represents the typical range of process variations expected to occur in the fab.

Factors that limit or degrade the fidelity of the pattern transfer process include imperfections in the mask-making process, in the projection optics, in the resist process, and in the control of the interaction between the projected light and the film stacks formed on the wafer. However, even with a perfect mask, perfect optics, a perfect resist system, and perfect substrate reflectivity control, image fidelity becomes difficult to maintain as the dimensions of the features being imaged become smaller than the wavelength of light used in the exposure tool. For exposure processes using 193 nm illumination sources, features as small as 65 nm are desired. In this deep sub-wavelength regime, the pattern transfer process becomes highly non-linear, and the dimensions of the final pattern at the wafer level become a very sensitive function not only of the size of the pattern at the mask level, but also of the local environment of the feature, where the local environment extends out to a radius of roughly five to ten times the wavelength of light. Given the very small feature sizes compared to the wavelength, even identical structures on the mask will have different wafer-level dimensions depending on the sizes and proximities of neighboring features, and even features that are not immediately adjacent but still within the proximity region defined by the optics of the exposure tool. These optical proximity effects are well known in the literature.

In an effort to improve imaging quality and minimize high non-linearity in the pattern transfer process, current processing techniques employ various resolution enhancement technologies ("RET"). One of the leading types of RETs in use today is optical proximity correction (OPC), a general term for any technology aimed at overcoming proximity effects. One of the simplest forms of OPC is selective bias. Given a CD vs. pitch curve, all of the different pitches could be forced to produce the same CD, at least at best focus and exposure, by changing the CD at the mask level. Thus, if a feature prints too small at the wafer level, the mask level feature would be biased to be slightly larger than nominal, and vice versa. Since the pattern transfer process from mask level to wafer level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. Therefore, the "best" bias to give identical CD vs. pitch may even have a negative impact on the overall process window, reducing rather than enlarging the focus and exposure range within which all of the target features print on the wafer within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the key goals of integrated circuit design and manufacturing is to maximize the number of functional elements while minimizing the area required per chip, adding excess spacing is a highly undesirable solution.

Two-dimensional OPC approaches have been developed to help solve the line end pull back problem. Extra structures (or assist features) known as "hammerheads" or "serifs" are routinely added to line ends to effectively anchor them in place and provide reduced pull back over the entire process window. Even at best focus and exposure these extra structures are not clearly resolved and they alter the appearance of the main feature without being fully resolved on their own. Assist features can take on much more aggressive forms than simple hammerheads added to line ends, to the extent the pattern on the mask is no longer simply the desired wafer pattern by the reduction ratio. Assist features such as serifs can be applied to many more cases than simply reducing line end pull back. Inner or outer serifs can be applied to any edge, especially two dimensional edges, to reduce corner rounding or edge extrusions. With enough selective biasing and assist features of all sizes and polarities, the features on the mask bear less and less of a resemblance to the final pattern desired at the wafer level. In general, the mask pattern becomes a pre-distorted version of the wafer-level pattern, where the distortion is intended to counteract or reverse the pattern deformation that will occur during the lithographic process to produce a pattern on the wafer that is as close to the one intended by the designer as possible.

In another OPC technique, instead of appending assist structures such as serifs to a feature, completely independent and non-resolvable assist features are added to the mask. These independent assist features are not intended or desired to print as features on the wafer, but rather are intended to modify the aerial image of a nearby main feature to enhance the printability and process tolerance of that main feature. Often referred to as "scattering bars," this type of sub-resolution assist features (SRAF) add yet another layer of complexity to a mask. A simple example of a use of scattering bars is where a regular array of non-resolvable scattering bars is drawn on both sides of an isolated line feature, which has the effect of making the isolated line appear, an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the mask level.

Many of these OPC techniques must be used together on a single mask with phase-shifting structures of different phases added in as well for both resolution and process window enhancement. The simple task of biasing a one-dimensional line becomes increasingly complicated as two-dimensional structures must be moved, resized, enhanced with assist features, and possibly phase-shifted without causing any conflict with adjoining features. Due to the extended proximity range of deep sub-wavelength lithography, changes in the type of OPC applied to a feature can have unintended consequences for another feature located within half a micron to a micron. Since there are likely to be many features within this proximity range, the task of optimizing OPC decoration becomes increasingly complex with the addition of more aggressive approaches. Each new feature that is added to a design has an effect on other features, which then must be re-corrected in turn, and the results must be iterated repeatedly to converge to a mask layout where each feature can be printed in the manner in which it was originally intended while at the same time contributing in the proper manner to the aerial images of its neighboring features such that they too are printed within their respective tolerances.

Due to this complexity and mutual interaction between features, OPC technology has become a major field of innovation and many techniques have been widely described on how to "segment" or "dissect" the features into a manageable number of edges for co-optimization, how to prioritize the optimization routines so that the most critical structures are best protected from unintended distortion by nearby OPC assist features on neighboring features, how to resolve phase and placement conflicts between features, how to trade off computational speed versus ultimate convergence of the resulting feature to the desired results, and other details of the full implementation of OPC as a manufacturable technology.

Figure 2:
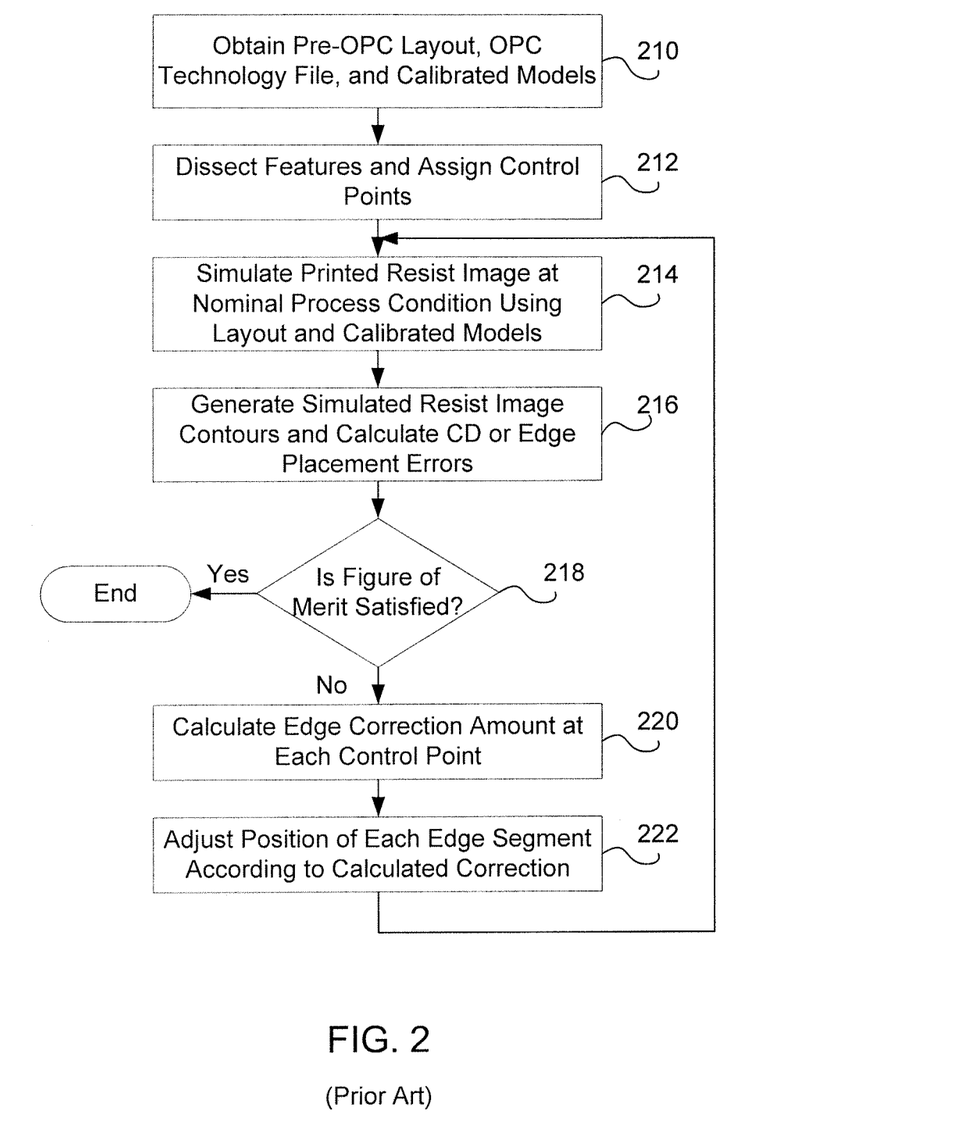
FIG. 2 is a flowchart of method steps for model-based OPC.

OPC has generally moved from a rule-based to a model-based approach. In model-based OPC, both the effect of the exposure tool on the aerial image and the effect of the resist processing are modeled mathematically. FIG. 2 is a flowchart showing a typical model-based OPC design process. In step 210, a pre-OPC layout, an OPC technology file, an optical model, and a resist model are obtained. The OPC technology file describes the types of model-based OPC techniques that are to be used, for example linewidth bias corrections, corner rounding corrections, or line end pull back corrections. The optical model describes the illumination and projection optics of the exposure tool. The optical model may also include the effect of imaging into a thin-film resist or the effect of the mask topography. The resist model describes the changes in the resist after being illuminated by the mask pattern in the exposure tool. An etch model may also be used in the method of FIG. 2. The optical, resist, and etch models can be derived from first principles, determined empirically from experimental data, or a combination of both. The models are usually calibrated at the nominal process condition. See R. Socha, "Resolution Enhancement Techniques," Photomask Fabrication Technology, Benjamin G. Eynon, Jr. and Banqiu Wu, Editors, McGraw-Hill, pp. 466-468,2005. The pre-OPC layout, the OPC technology file, and the models are all inputs to the model-based OPC software.

Figure 3:
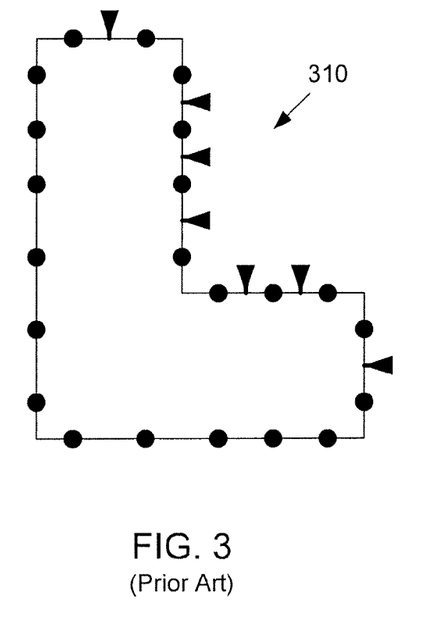
FIG. 3 is a diagram of a feature including edge segments and control points.

In step 212, the model-based OPC software dissects the features in the pre-OPC layout into edge segments and assigns control points to each edge segment. Each feature is dissected prior to applying any OPC techniques because each feature, even identically-shaped features, will be subject to different proximity environments. The control points (or evaluation points) are the locations where CD or edge placement errors (EPE) will be evaluated during the OPC design process. The assignment of the control points is a complex process that depends on the pattern geometry of the pre-OPC layout and the optical model. FIG. 3 shows an L-shaped feature 310 with dissection points represented by triangles and assigned control points represented by circles.

In step 214, the model-based OPC software simulates the printed resist image on the wafer by applying the optical model and the resist model to the pre-OPC layout. In general, the simulation is performed at the nominal process condition at which the optical model has been calibrated. In step 216, the model-based OPC software generates the contours of the simulated resist image by comparing the simulated resist image values to a predetermined threshold value. The model-based OPC software then compares the simulated contours with the pre-OPC layout at all of the control points to determine if the design layout will deliver the desired patterning performance. The comparisons are typically quantified as a CD or an EPE at each control point. In step 218, the model-based OPC software determines whether a figure of merit for the contour metric of each edge segment is satisfied. In one embodiment, the figure of merit is satisfied when the total error for the contour metric, e.g., CD or EPE, of each edge segment is minimized. In another embodiment, the figure of merit is satisfied when the total error for the contour metric of each edge segment is below a predetermined threshold. If the figure of merit is satisfied the process ends, but if the figure of merit is not satisfied, the process continues with step 220.

Figure 4:
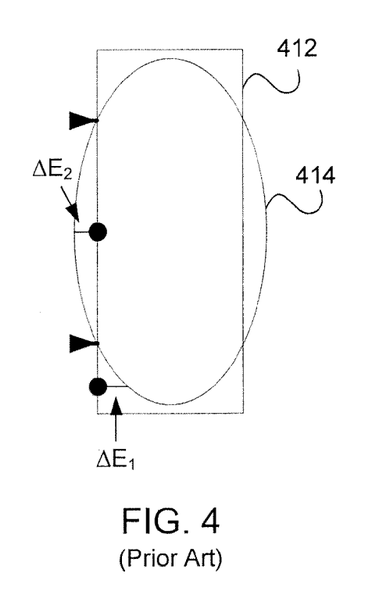
FIG. 4 is a diagram of a feature and an assumed simulated resist image showing edge placement errors.

FIG. 4 shows two EPEs with opposite signs measured at two control points. If an assumed simulated resist image contour 414 does not overlap the feature's designed geometry 412 at the control point, then the EPE is determined based on the difference at that control point. Returning to FIG. 2, in step 220 the model-based OPC software calculates the edge correction amount at each control point. If it is assumed that the EPE of the i-th edge segment ($E_i$) is $\Delta E_i$ determined at control point $C_i$, the simplest edge correction amount $\Delta L_i$, is a negation of the error: $\Delta L_i = -\Delta E_i$. Such a straightforward correction function does not work well for non-linear processes because changes on the mask are not linearly reflected in the printed resist image. To account for nonlinearities such as the mask error factor (MEF), a slightly more complicated correction function can be used:

$$\Delta L_i = -\frac{\Delta E_i}{MEF}.$$

In a real application, the method of calculating the appropriate correction is much more complex, and the correction algorithms can depend on factors such as linewidth error, fabrication process, correction goals, and constraints. See A. K. Wong, Resolution Enhancement Techniques in Optical Lithography, SPIE Press, pp. 91-115, 2001. For example, if it is assumed that there are N edge segments of a feature and one control point for each edge segment, and that the correction amount for the i-th edge segment is $\Delta L_i$, the ultimate goal is to solve for $\Delta L_1, \Delta L_2, \ldots, \Delta L_N$, such that the difference between resist image values $RI(C_i)$ and the predetermined threshold values T at all control points are equal to zero as:

$RI(C_i)-T=0$ for $i=1,\ldots,N$, where $C_i$ are the control points.

Or minimize the function $$\sum_{i=1}^{N} [RI(C_i) - T]^2$$

Next, in step 222, the model-based OPC adjusts the entire edge segment $E_i$ according to the calculated correction amount $\Delta L_1$ for all edge segments to produce a post-OPC layout, such that the simulated resist image contour moves to match the design geometry. Then the method returns to step 214, where the model-based OPC software simulates a resist image using the post-OPC-layout produced in step 222. The resist image contours and error are then calculated for the simulated resist image produced using the post-OPC layout in step 216. In step 218 the model-based OPC software determines whether the total EP error is minimized or below a certain threshold. The total EP error may be defined as:

$$Error_{total} = \sum_{i=1}^{N} (\Delta E_i)^2$$

Alternatively, the total EP error can be defined as the maximum EP error of all segments, i.e., $\max\{|\Delta E_i|\}, i=1,\ldots,N$ since the OPC goal may be set such that all edge placement error must be below a certain threshold.

In the method of FIG. 2, the correction amount is determined individually for each edge segment in the mask layout, without taking into account effects from the movements of other edge segments in the layout. As feature size decreases, solving for the correction amount for individual edge segments experiences convergence problems. What is needed is a technique for determining correction amounts for each edge segment that takes into account the movements of other edge segments in the layout.

SUMMARY

The method of the invention tracks how the collective movement of edge segments in a mask layout alters the resist image values at control points in the layout and simultaneously determines a correction amount for each edge segment in the layout. A multisolver matrix that represents the collective effect of movements of each edge segment in the mask layout is used to simultaneously determine the correction amount for each edge segment in the mask layout.

In one embodiment, the method of the invention includes simulating a photolithography process using a mask layout to produce a first simulated resist image, perturbing each edge segment in the mask layout by a predetermined amount to produce an initial perturbed layout, simulating the photolithography process using the initial perturbed layout to produce a second simulated resist image, determining a difference value between the first simulated resist image and the second simulated resist image for each edge segment, creating a multisolver matrix that includes the difference values for all edge segments, determining a correction delta vector using a pseudoinverse of the multisolver matrix, wherein the correction delta vector includes a correction delta value for each edge segment, perturbing each edge segment in the perturbed layout by the corresponding correction delta value in the correction delta vector to create a further perturbed layout, simulating the photolithography process using the further perturbed layout to produce a third simulated resist image, updating the multisolver matrix based on the third simulated resist image values for each edge segment, and updating the correction delta vector using a pseudoinverse of the updated multisolver matrix.

In one embodiment, the method of the invention includes multiplying a damping factor to each value in the correction delta vector prior to adjusting the locations of the edge segments in the mask layout according to the correction delta vector.

DETAILED DESCRIPTION

Figure 5:
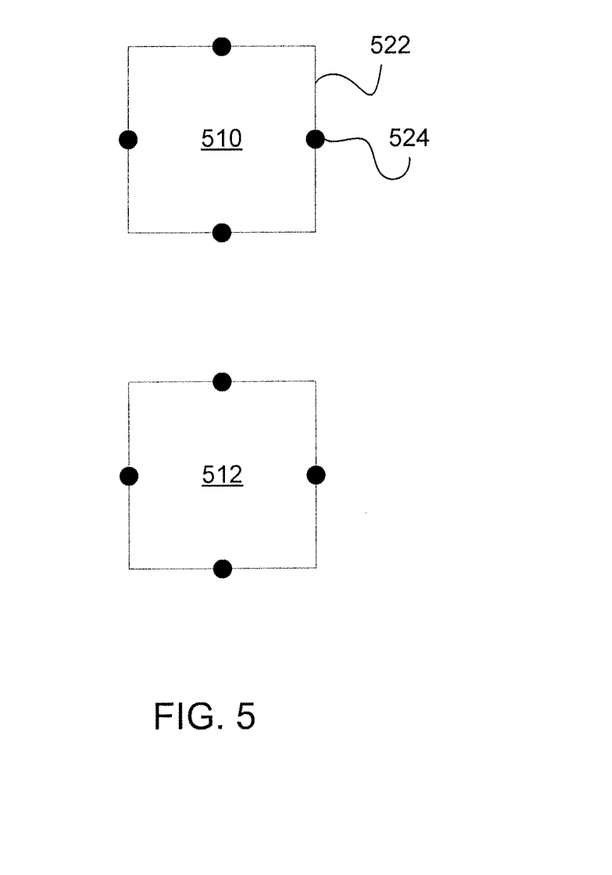
FIG. 5 is a diagram of contact features including edge segments and control points.

The method of the invention tracks how the collective movement of edge segments in a mask layout alters the resist image values at control points in the layout and simultaneously determines a correction amount for each edge segment in the layout. FIG. 5 is a diagram of contact features 510 and 512 including edge segments and control points. Contact feature 510 has four edge segments whose locations can be adjusted, and each edge segment has one control point. For example edge segment 522 has a control point 524. As contact features 510 and 512 are relatively small features, moving an edge segment, for example edge segment 522, affects the resist image value at that edge segment's control point control point 524) and also affects the resist image values at the control points of the other three edge segments of the contact feature. And for contact features that are placed close together in the layout, moving an edge segment of one contact feature also affects the resist image values at the control points of edge segments in neighboring contact features. Similar effects on resist image values at control points due to movements of neighboring edge segments can be observed in mask layouts for non-contact layers.

Figure 6:
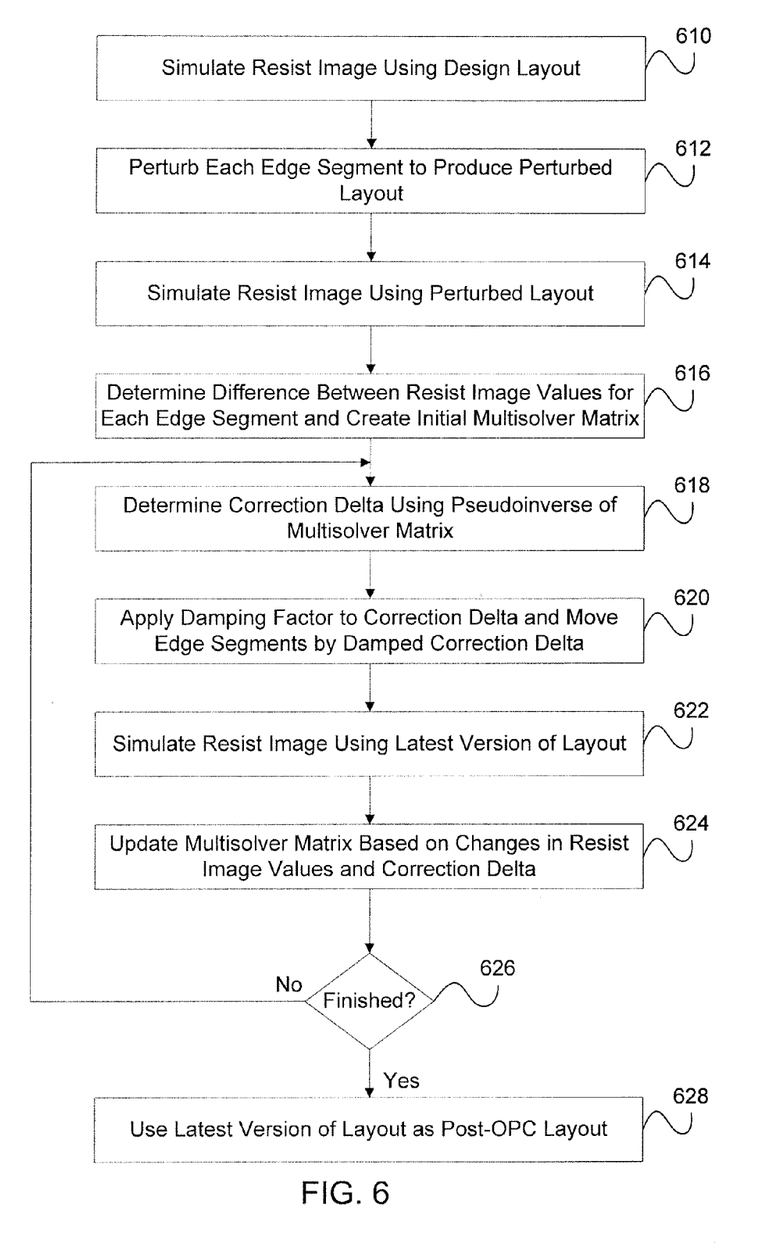
FIG. 6 is a flowchart of method steps for simultaneously solving for corrections for edge segments in a mask layout, according to one embodiment of the invention.

FIG. 6 is a flowchart of method steps for simultaneously solving for corrections for edge segments in a mask layout, according to one embodiment of the invention. Optionally, for a large mask layout, the layout is first subdivided into patches, which are typically 20 µm×20 µm to 60 µm is area, before applying OPC; after OPC has been applied the patches are combined together to produce the final post-OPC layout. In step 610, a resist image (RI) is simulated using a design layout (pre-OPC layout). The resist image may be simulated using a photolithography simulation system such as that disclosed in U.S. Pat. No. 7,003,758, the subject matter of which is hereby incorporated by reference in its entirety. In step 612, assuming there exist n movable edge segments, the edge segments in the design layout are perturbed (i.e., moved) by a predetermined distance, which is specified by the n×1 vector $\vec{\Delta c_o}$, to produce a perturbed layout. In step 614, a resist image is simulated using the perturbed layout.

In step 616, a difference between the simulated RI values produced using the design layout and the simulated RI values produced using the perturbed layout are determined for each edge segment. These differences are used to create an initial multisolver matrix, $A_0$. The initial multisolver matrix is an n×n matrix, where n is the number of edge segments in the layout, which for some masks can be more than a million. The initial multisolver matrix is a diagonal matrix in which the i-th diagonal entry, where i=1, ..., N, is computed as the differences between the simulated RI values of the i-th segment $\Delta RI_i$ divided by the amount of the perturbation of the i-th segment $\Delta c_{o,i}$. Mathematically, the i-th diagonal entry of $A_0$ is given by:

$$[A_0]_{ii} = \frac{\Delta RI_i}{\Delta c_{o,i}}.$$

In other words, initially it is assumed that the edge segments do not interact; the changes in each edge segment's RI value is attributed to that edge segment only. As a diagonal matrix, the off-diagonal elements of $A_0$ are identically zero. That is, $$[A_0]_{ij} = 0 \text{ for } i \neq j.$$

In step 618, a correction delta vector for the edge segments in the layout is determined using a pseudoinverse of the multisolver matrix. The correction delta vector $\vec{\Delta c}$ includes a correction delta value for each edge segment. The values for the correction delta vector are determined by first computing the difference between the desired RI values and the latest simulated RI values determined in step 616 (or later in step 622) and then multiplying the pseudoinverse of the multisolver matrix by the difference:

$$\vec{\Delta c} = A_k^+ \bullet (\vec{0} - \vec{F}(\vec{c_k}))$$

Where $A_k^+$ is the pseudoinverse of the multisolver n×n matrix, $\vec{0}$ is an n×1 vector representing the desired RI values, $\vec{F}(\vec{c_k})$ is an n×1 vector representing the latest simulated RI values when the edge segments have been moved to the position values as specified by the vector $\vec{c}_k$, and k is an index of the iterations of step 618.

The pseudoinverse of the multisolver matrix is used because the multisolver matrix can be singular or close to being singular, or since it may not always be a square matrix, if the problem is generalized such that the number of control point where RI values are obtained is not the same as the number of adjustable edge segment, the true inverse may not always be calculable. The pseudoinverse of the multisolver matrix, $A_k^+$ is defined as follows:

$$A_k^+ = (\alpha I + A_k^T A_k)^{-1} A_k^T$$

Where $A_k^T$ the transpose of the multisolver matrix, I is the n×n identity matrix, and α is an adjustable positive multiplicative factor applied to the identity matrix. The value of α is preferably set to a default value but it may be adjusted to optimize the overall performance of the method of FIG. 6.

As the multisolver matrix resulting from the method of FIG. 6 may grow to be as large as 1 million×1 million, the multisolver matrix A is preferably expressed as three components:

$$A = A_0 + PQ^T \in \mathfrak{R}^{n \times n}$$

where $A_0$ is the initial multisolver matrix, which is a diagonal matrix, P and Q are n×p matrices, where n is the number of edge segments and p is the number of columns of P and Q, where p<<n. Since p=0 initially, the matrices P and Q are initially empty. The of P and Q are populated by the updates to the multisolver matrix, as described below in conjunction with step 624. As the number of updates increases with the number of iterations, optionally the maximum number of updates that are stored in the matrices P and Q can be limited. For example, the maximum value of p can be limited to $p_{max}$ and the $p_{max}$-most recent updates are stored. Expressing the multisolver matrix as these three components allows for efficient storage of the multisolver matrix and also for efficient calculation of the correction delta vector as described below. For example, assuming n=1,000,000 and p=10, to store n×n multisolver matrix A as it is using a floating-point representation would consume n×n×4=4 trillion bytes. In contrast, storing the diagonal entries of the initial multisolver matrix $A_0$ and matrices P and Q will consume (n+n×p×2)×4=84 million bytes only.

With the creation of interim matrices, the correction delta vector is calculated as follows:

$$\vec{\Delta c} = [\Lambda^{-1} - G(D^{-1} + C^T G)^{-1} G^T](A_0 + QP^T) \bullet (\vec{0} - \vec{F}(\vec{c_k}))$$

where $\Lambda^{-1} \equiv (\alpha I + A_o A_o)^{-1}$, a diagonal matrix C [Q $A_o$P], an 2p×2p matrix, $G \equiv \Lambda^{-1} C$, an n×2p matrix; and $$D \equiv \begin{bmatrix} P^T P & I \\ I & 0 \end{bmatrix},$$

a 2p×2p matrix. By first expressing the multisolver matrix as three components and creating the interim matrices, calculating the correction delta vector is performed efficiently. Specifically, the inverse of $(D^{-1} + C^T G)$ in the above equation can be computed quickly, since $(D^{-1} + C^T G)$ is an 2p×2p matrix, where p is typically equal to 10. For example, assuming that n=400,000 and p=10, the correction delta vector is determined using the above equation by computing the inverse of a 20×20 matrix, instead of computing the inverse of a 400,000×400,000 matrix. Calculating the correction delta vector using the above equation where the multisolver matrix is a 400,000×400,000 matrix can be performed in about one second. In contrast, just inverting a 400,000×400,000 matrix using a brute force method would take over two years. To further speed up the computation, the inverse of D can be computed analytically as:

$$D^{-1} \equiv \begin{bmatrix} 0 & I \\ I & -P^T P \end{bmatrix}.$$

In one embodiment, at each iteration, a correction delta vector $\vec{\Delta c}$ that minimizes $|A\vec{\Delta C} + \vec{F}(\vec{c}_k) + \alpha|\vec{\Delta c}|^2$ is computed. It is possible to assign different priorities, or weighting factors, to the edge segments. A diagonal matrix W, where the non-negative weighting factors appear on the diagonal, is introduced, where $|W[A\vec{\Delta C} + \vec{F}(\vec{c}_k)]|^2 + \alpha|\vec{\Delta C}|^2$ is minimized. In one embodiment, the quantities A and $\vec{F}(\vec{c}_k)$ are replaced with:

$$A \leftarrow WA$$

$$\vec{F}(\vec{c}_k) \leftarrow W\vec{F}(\vec{c}_k)$$

when computing the correction delta vector.
In another embodiment using the optimized matrix representation $A \equiv A_o + PQ^T \in \mathfrak{R}^{n \times n}$, the quantities $A_0$, P, and $\vec{F}(\vec{c}_k)$ are replaced with:

$$A_0 \leftarrow WA_0$$

$$P \leftarrow WP$$

$$\vec{F}(\vec{c}_k) \leftarrow W\vec{F}(\vec{c}_k)$$

when computing the correction delta vector. By default, the matrix W is equal to the identity matrix. If a large weighting factor (>>1) is assigned to the i-th diagonal of W that corresponds to the i-th segment, at each iteration, the EPE of the i-th segment will preferably be reduced more than the EPE for the remaining segments because the i-th segment's EPE is amplified by the weighting factor.

In step 620, a damping factor is applied to the correction delta vector and the edge segments in the layout are moved by the values in the damped correction delta vector, such that the next position of the edge segments is $$\vec{c}_{k+1} = \vec{c}_k + \vec{\Delta c} \bullet damping$$

The damping factor is a value between zero and one that is applied to the correction delta vector so that the next position of the edge segments is not too aggressive. Then, in step 622, a resist image is simulated using the latest version of the layout. In step 624, the multisolver matrix is updated based on changes in the RI values caused by the changes in position of the edge segments. Updating the multisolver matrix is necessary because the multisolver matrix, which relates changes in the correction values to the RI values linearly, changes when the edge segments are moved. If a vector $\vec{y}$ is defined as $\vec{F}(\vec{c}_{k+1}) - \vec{F}(\vec{c}_k)$ and a vector s is defined as $\vec{c}_{k+1} - \vec{c}_k$, then to update the multisolver matrix A, if $\|\vec{s}\| > 0$, $$\frac{(\vec{y} - A_k \vec{s})}{\|\vec{s}\|}$$

is added as a new column to the matrix P and $$\frac{\vec{s}}{\|\vec{s}\|}$$

is added as a new column to the matrix Q. As a result of the update, the initially diagonal multisolver matrix A is no longer diagonal. The value of the multisolver matrix at the i-th row and the j-th column can be interpreted as the linear change in the RI value of the i-th edge segment caused by a positional change of the j-th edge segment. If A is not expressed as $A \equiv A_0 + PQ^T$ but instead is used directly, the updated multisolver matrix can be obtained as, if $\|\vec{s}\| > 0$;

$$A_{k+1} = A_k - \frac{(\vec{y} - A_k \vec{s})\vec{s}^T}{\|\vec{s}\|^2}$$

In step 626, it is determined whether adjustments of the locations of the edge segments in the layout is finished. In one embodiment, the adjustments are finished when a predetermined number of iterations of steps 618-624 have been completed. In the predetermined number of iterations have not been completed, the method returns to step 618. In another embodiment, the adjustments are finished when a figure of merit is satisfied. The figure of merit may be satisfied when the sum of the edge placement errors squared for the layout is minimized or below a predetermined threshold. If the figure of merit is not satisfied, the method returns to step 618. If the adjustments are finished, then in step 628 the latest version of the layout is used as the post-OPC layout, which is typically then used to manufacture a mask.

The method of FIG. 6 may be implemented in software or in hardware. Embodiments of the method of FIG. 6 implemented in software can be executed on any appropriate computer system. The method of FIG. 6 can be applied to any mask layout for any type of mask layer, for example contact layers and poly layers, and any type of mask, for example bright-field masks or dark-field masks. The method of FIG. 6 can also be applied to mask layouts for masks used in double-dipole illumination photolithography. Correction delta vectors can be determined for each of the two mask layouts used in double-dipole illumination such that the aerial image at low contrast is equal to zero and the resist image values from both masks is equal to zero.

Figure 7:
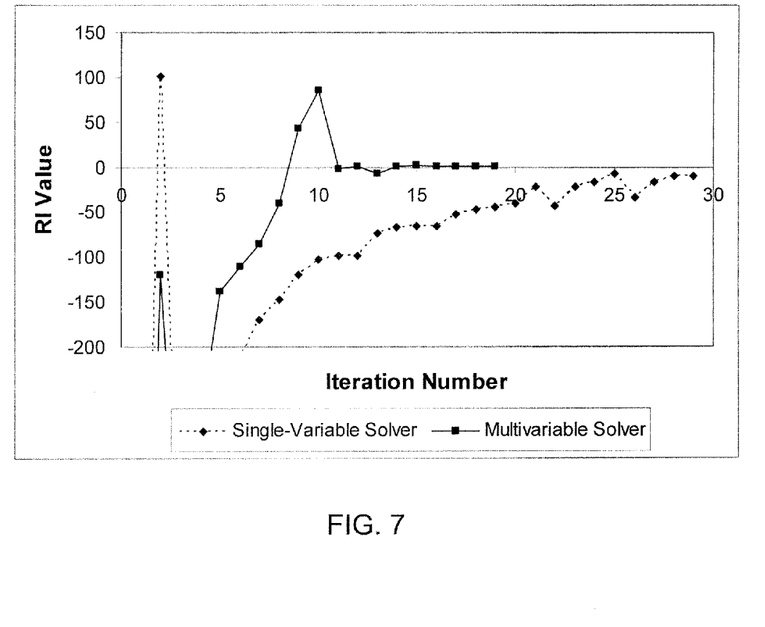
FIG. 7 is a diagram of plots of resist image values versus iteration number for a typical edge segment in a contact features, determined by a prior art single-variable solver and by the method of FIG. 6.

FIG. 7 is a diagram of plots of resist image values versus iteration number for a typical edge segment in a contact features, determined by a prior art single-variable solver and by the method of FIG. 6. As shown, the RI values resulting from corrections determined using the multisolver method of FIG. 6 converges faster (at iteration 11) to the desired RI value of zero than the prior art single-variable solver (at iteration 29).

Figure 8:
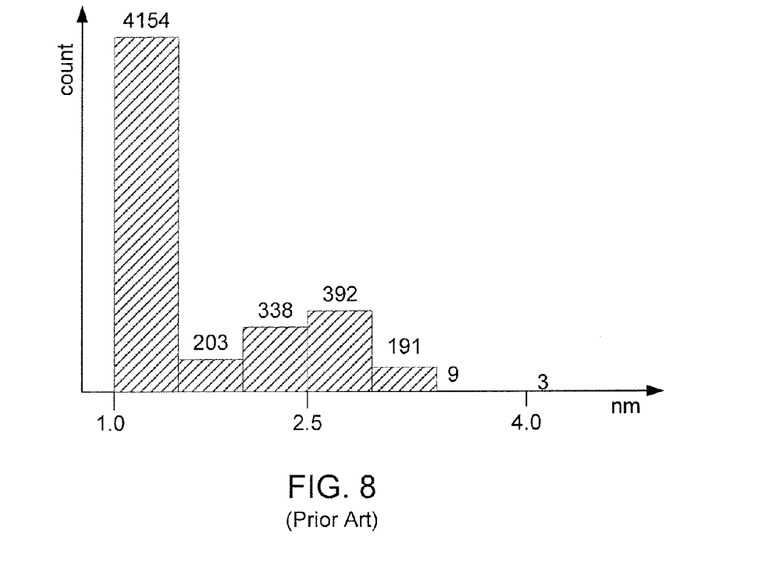
FIG. 8 is a histogram of edge placement errors after applying OPC corrections using a prior art single-variable solver.
Figure 9:
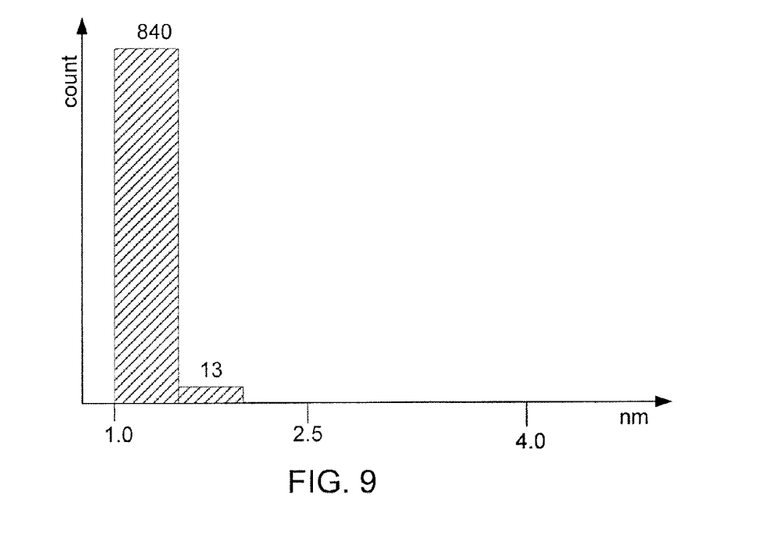
FIG. 9 is a histogram of edge placement errors after applying corrections using the method of FIG. 6.

FIG. 8 is a histogram of edge placement errors after applying OPC corrections determined using a prior art single-variable solver after six OPC iterations. The distribution shown in FIG. 8 ranges from 1.0 to 4.2 nm, and the distribution has a root-mean-square (RMS) value of 0.61 nm. FIG. 9 is a histogram of edge placement errors after applying OPC corrections determined using the method of FIG. 6 after six OPC iterations. The distribution shown in FIG. 9 ranges from 1.0 to 1.7 nm, and the distribution has an RMS value of 0.11 nm. Thus, using the multivariable-solver method of FIG. 6 to determine corrections for edge segments produced fewer edge placement error "defects" and the distribution of edge placement errors is narrower.

The invention has been described above with reference to specific embodiments. It will, however, be evident that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A computer-implemented method comprising:
   determining, by the computer, a difference image value for a plurality of control points in a mask layout due to one or more perturbations applied to features in the mask layout associated with the control points;
   creating, by the computer, a multisolver matrix that includes the difference image values for all of the plurality of control points;
   simultaneously determining, by the computer, a correction delta value for each of the plurality of control points in the mask layout using the multisolver matrix.

2. The method of claim 1, wherein a pseudoinverse of the multisolver matrix, $A^+$, is defined as $$A^+ = (\alpha I + A^T A)^{-1} A^T$$

where $A^T$ is the transpose of the multisolver matrix, I is the identity matrix, and $\alpha$ is an adjustable positive multiplicative factor applied to the identity matrix.

3. The method of claim 2, wherein an initial multisolver matrix $A_0$ is a diagonal matrix in which the i-th diagonal entry is determined by $$[A_0]_{ii} = \Delta I_i / \Delta c_0, i,$$

where $\Delta c_0$, i is the amount of the perturbation of the feature associated with the i-th control point and $\Delta I_i$ is the difference image value for the i-th control point as a result of the perturbation.

4. The method of claim 1, wherein the multisolver matrix, A, is expressed as $$A \equiv A_0 + PQ^T \in \mathfrak{R}^{n \times n},$$

where $A_0$ is an initial multisolver matrix, which is a diagonal matrix, P and Q are n×p matrices, where n is the number of control points and p is the number of columns of P and Q.

5. The method of claim 4, wherein the initial multisolver matrix $A_0$ is a diagonal matrix in which the i-th diagonal entry is determined by $$[A_0]_{ii} = \Delta I_i / \Delta c_0, i,$$

where $\Delta c_0$, i is the amount of the perturbation of the feature associated with the i-th control point and $\Delta I_i$ is the difference image value for the i-th control point as a result of the perturbation.

6. The method of claim 1, wherein determining the difference image value includes:
   simulating a photolithography process using a mask layout to produce a first simulated image;
   perturbing the features associated with each of the plurality of control points in the mask layout by a predetermined amount to produce an initial perturbed layout;
   simulating the photolithography process using the initial perturbed layout to produce a second simulated image;
   determining the difference image value between the first simulated image and the second simulated image for each of the plurality of control points.

7. The method of claim 1, wherein simultaneously determining the correction delta values includes determining a correction delta vector using a pseudoinverse of the multisolver matrix, wherein the correction delta vector includes the correction delta values.

8. The method of claim 7, further comprising:
   perturbing the features associated with each of the plurality of control points in the perturbed layout by the corresponding correction delta value in the correction delta vector to create a further perturbed layout;
   simulating the photolithography process using the further perturbed layout to produce a third simulated image;
   updating the multisolver matrix based on the third simulated image values for each of the plurality of control points; and
   updating the correction delta vector using a pseudoinverse of the updated multisolver matrix.

9. A computer program product comprising a non-transitory computer readable medium for storing instructions for causing a computer to perform a method comprising:
   determining, by the computer, a difference image value for a plurality of control points in a mask layout due to one or more perturbations applied to features in the mask layout associated with the control points;
   creating, by the computer, a multisolver matrix that includes the difference image values for all of the plurality of control points;
   simultaneously determining, by the computer, a correction delta value for each of the plurality of control points in the mask layout using the multisolver matrix.

10. The computer program product of claim 9, wherein a pseudoinverse of the multisolver matrix, $A^+$, is defined as $$A^+ = (\alpha I + A^T A)^{-1} A^T$$

where $A^T$ is the transpose of the multisolver matrix, I is the identity matrix, and $\alpha$ is an adjustable positive multiplicative factor applied to the identity matrix.

11. The computer program product of claim 10, wherein an initial multisolver matrix $A_0$ is a diagonal matrix in which the i-th diagonal entry is determined by $$[A_0]_{ii} = \Delta I_i / \Delta c_0, i,$$

where $\Delta c_0$, i is the amount of the perturbation of the feature associated with the i-th control point and $\Delta I_i$ is the difference image value for the i-th control point as a result of the perturbation.

12. The computer program product of claim 9, wherein the multisolver matrix, A, is expressed as $$A = A_0 + PQ^T \in \Re^{n \times n},$$

where $A_0$ is an initial multisolver matrix, which is a diagonal matrix, P and Q are n×p matrices, where n is the number of control points and p is the number of columns of P and Q.

13. The computer program product of claim 12, wherein the initial multisolver matrix $A_0$ is a diagonal matrix in which the i-th diagonal entry is determined by $$[A_0]_{ii} = \Delta I_i / \Delta c_0, i,$$

where $\Delta c_0$, i is the amount of the perturbation of the feature associated with the i-th control point and $\Delta I_i$ is the difference image value for the i-th control point as a result of the perturbation.

14. The computer program product of claim 9, wherein determining the difference image value includes:
   simulating a photolithography process using a mask layout to produce a first simulated image;
   perturbing the features associated with each of the plurality of control points in the mask layout by a predetermined amount to produce an initial perturbed layout;
   simulating the photolithography process using the initial perturbed layout to produce a second simulated image;
   determining the difference image value between the first simulated image and the second simulated image for each of the plurality of control points.

15. The computer program product of claim 9, wherein simultaneously determining the correction delta values includes determining a correction delta vector using a pseudoinverse of the multisolver matrix, wherein the correction delta vector includes the correction delta values.

16. The computer program product of claim 15, the method further comprising:
   perturbing the features associated with each of the plurality of control points in the perturbed layout by the corresponding correction delta value in the correction delta vector to create a further perturbed layout;
   simulating the photolithography process using the further perturbed layout to produce a third simulated image;
   updating the multisolver matrix based on the third simulated image values for each of the plurality of control points; and
   updating the correction delta vector using a pseudoinverse of the updated multisolver matrix.

17. A system that generates mask image data for a mask layout that includes features, the system comprising a computer adapted to determine a configuration of the features by:
   determining, by the computer, a difference image value for a plurality of control points in the mask layout due to one or more perturbations applied to features in the mask layout associated with the control points;
   creating, by the computer, a multisolver matrix that includes the difference image values for all of the plurality of control points;
   simultaneously determining, by the computer, a correction delta value for each of the plurality of control points in the mask layout using the multisolver matrix.

18. The system of claim 17, wherein a pseudoinverse of the multisolver matrix, $A^+$, is defined as $$A^+ = (\alpha I + A^T A)^{-1} A^T$$

where $A^T$ is the transpose of the multisolver matrix, I is the identity matrix, and $\alpha$ is an adjustable positive multiplicative factor applied to the identity matrix.

19. The system of claim 18, wherein an initial multisolver matrix $A_0$ is a diagonal matrix in which the i-th diagonal entry is determined by $$[A_0]_{ii} = \Delta I_i / \Delta c_0, i,$$

where $\Delta c_0, i$ is the amount of the perturbation of the feature associated with the i-th control point and $\Delta I_i$ is the difference image value for the i-th control point as a result of the perturbation.

20. The system of claim 17, wherein the multisolver matrix, A, is expressed as $$A = A_0 + PQ^T \in \mathfrak{R}^{n \times n},$$

where $A_0$ is an initial multisolver matrix, which is a diagonal matrix, P and Q are n×p matrices, where n is the number of control points and p is the number of columns of P and Q.

21. The system of claim 20, wherein the initial multisolver matrix $A_0$ is a diagonal matrix in which the i-th diagonal entry is determined by $$[A_0]_{ii} = \Delta I_i / \Delta c_0, i,$$

where $\Delta c_0, i$ is the amount of the perturbation of the feature associated with the i-th control point and $\Delta I_i$ is the difference image value for the i-th control point as a result of the perturbation.

22. The system of claim 17, wherein determining the difference image value includes:
  simulating a photolithography process using a mask layout to produce a first simulated image;
  perturbing the features associated with each of the plurality of control points in the mask layout by a predetermined amount to produce an initial perturbed layout;
  simulating the photolithography process using the initial perturbed layout to produce a second simulated image;
  determining the difference image value between the first simulated image and the second simulated image for each of the plurality of control points.

23. The system of claim 17, wherein simultaneously determining the correction delta values includes determining a correction delta vector using a pseudoinverse of the multisolver matrix, wherein the correction delta vector includes the correction delta values.

24. The system of claim 23, wherein determining the configuration of the features further comprises:
  perturbing the features associated with each of the plurality of control points in the perturbed layout by the corresponding correction delta value in the correction delta vector to create a further perturbed layout;
  simulating the photolithography process using the further perturbed layout to produce a third simulated image;
  updating the multisolver matrix based on the third simulated image values for each of the plurality of control points; and
  updating the correction delta vector using a pseudoinverse of the updated multisolver matrix.

25. A method of manufacturing a mask comprising:
  generating a mask layout that includes features whose configurations have been determined by:
    determining, by the computer, a difference image value for a plurality of control points in the mask layout due to one or more perturbations applied to features in the mask layout associated with the control points;
    creating, by the computer, a multisolver matrix that includes the difference image values for all of the plurality of control points;
    simultaneously determining, by the computer, a correction delta value for each of the plurality of control points in the mask layout using the multisolver matrix.

26. The method of claim 25, wherein a pseudoinverse of the multisolver matrix, $A^+$, is defined as $$A^+ = (\alpha I + A^T A)^{-1} A^T$$

where $A^T$ is the transpose of the multisolver matrix, I is the identity matrix, and $\alpha$ is an adjustable positive multiplicative factor applied to the identity matrix.

27. The method of claim 26, wherein an initial multisolver matrix $A_0$ is a diagonal matrix in which the i-th diagonal entry is determined by $$[A_0]_{ii} = \Delta I_i / \Delta c_0, i,$$

where $\Delta c_0, i$ is the amount of the perturbation of the feature associated with the i-th control point and $\Delta I_i$ is the difference image value for the i-th control point as a result of the perturbation.

28. The method of claim 25, wherein the multisolver matrix, A, is expressed as $$A = A_0 + PQ^T \in \mathfrak{R}^{n \times n},$$

where $A_0$ is an initial multisolver matrix, which is a diagonal matrix, P and Q are n×p matrices, where n is the number of control points and p is the number of columns of P and Q.

29. The method of claim 28, wherein the initial multisolver matrix $A_0$ is a diagonal matrix in which the i-th diagonal entry is determined by $$[A_0]_{ii} = \Delta I_i / \Delta c_0, i,$$

where $\Delta c_0, i$ is the amount of the perturbation of the feature associated with the i-th control point and $\Delta I_i$ is the difference image value for the i-th control point as a result of the perturbation.

30. The method of claim 25, wherein determining the difference image value includes:
  simulating a photolithography process using a mask layout to produce a first simulated image;
  perturbing the features associated with each of the plurality of control points in the mask layout by a predetermined amount to produce an initial perturbed layout;
  simulating the photolithography process using the initial perturbed layout to produce a second simulated image;
  determining the difference image value between the first simulated image and the second simulated image for each of the plurality of control points.

31. The method of claim 25, wherein simultaneously determining the correction delta values includes determining a correction delta vector using a pseudoinverse of the multisolver matrix, wherein the correction delta vector includes the correction delta values.

32. The method of claim 31, wherein determining the configuration of the features further comprises:
  perturbing the features associated with each of the plurality of control points in the perturbed layout by the corresponding correction delta value in the correction delta vector to create a further perturbed layout;
  simulating the photolithography process using the further perturbed layout to produce a third simulated image;
  updating the multisolver matrix based on the third simulated image values for each of the plurality of control points; and
  updating the correction delta vector using a pseudoinverse of the updated multisolver matrix.

* * * * *